United States Patent Office 3,474,071
Patented Oct. 21, 1969

3,474,071

PHOTOSENSITIVE POLYCARBONAMIDES

Donald J. Byers, Pittsburgh, Pa., Robert M. Leekley, Appleton, Wis., and Margaret H. Murray, Stamford, Conn., assignors to Time, Incorporated, New York, N.Y., a corporation of New York No Drawing. Filed Mar. 10, 1967, Ser. No. 622,081
Int. Cl. C08g *20/38;* G03c *1/72*
U.S. Cl. 260—47 9 Claims

ABSTRACT OF THE DISCLOSURE

Photosensitive nylon, process for producing the same and printing plates using the same wherein the nylon is rendered photosensitive by attaching one or more para-benzoylphenyl glycidyl ether groups at the terminal portions of the nylon molecule.

The present invention relates in general to photosensitive compositions, and more particularly to photosensitive nylon, a process for producing the photosensitive nylon and printing plates containing the same.

It has been proposed heretofore to utilize nylon which has been rendered photosensitive for the production of photosensitive printing plates. Such photosensitive nylon printing plates are employed in the preparation of planographic, gravure and relief printing plates by exposing the photosensitive nylon printing plate to a source of actinic light through an image-bearing transparency, such as a negative or a positive, to convert the light-exposed portions of the photosensitive plate to a developer-insoluble state while retaining the unexposed portions of the photosensitive plate in developer-soluble state and then treating the light-exposed photosensitive plate with a developer to remove the developer-soluble portions of the latent image thereon while retaining the developer-insoluble portions of the image on the plate. However, nylon is not photosensitive per se and hence must in some way be rendered photosensitive.

Nylon has been rendered sensitive to light heretofore by the incorporation therein of sensitizing adjuncts. For example, it has been proposed to treat nylon with an ionizable salt, such as ammonium dichromate, to render the nylon photosensitive. A further heretofore proposed method for rendering nylon photosensitive has been the blending with nylon of a vinylidene monomer (U.S. Patent No. 3,081,168). Another proposed method for imparting photosensitivity to nylon has been the incorporating within the nylon molecule of light-sensitive stilbene units (U.S. Patent No. 2,997,391).

The objects of the present invention are to provide a further process for the preparation of a photosensitive nylon, the photosensitive nylon produced thereby and printing plates using the photosensitive nylon.

In general, the process of the present invention comprises heating a mixture, i.e., a physical mixture or a solution, of nylon and para-benzoylphenyl glycidyl ether to effect a chemical reaction between the ether and at least some of the terminal groups, usually amine and/or carboxylic acid groups, of the nylon. The details of the process of the invention are set forth below.

The nylon reactant is a well known material which is a synthetic thermoplastic linear polyamide having recurring amide groups as an integral part of the main polymer chain. Suitable polyamides include those described in U.S. Patents Nos. 2,071,250; 2,071,253; 2,130,523; 2,320,088; 2,430,860 and 2,441,057 and in J. Polymer Science, 2, 306–313, 412–419 (1947) and 3, 85–95 (1948). The nylon or polyamide is thus a condensation polymer of dicarboxylic acids and diamines or of their salts; of aminocarboxylic acids or their lactams; or of interpolymers comprising these two types of polymers. Examples thereof include epsilon-caprolactam polymers, sebacic acid-hexamethylene diamine polymers, adipic acid-hexamethylene diamine polymers, and the interpolymers of epsilon-caprolactam with sebacic and/or adipic acid and hexamethylene diamine, in varying proportions.

The other reactant is commercially available para-benzoylphenyl glycidyl ether, also known as 3-(4′-benzoylphenoxy)-1,2-epoxypropane, which material has the following structural formula:

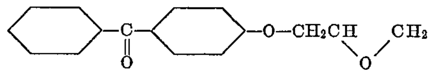

Para-benzoylphenyl glycidyl ether may be prepared by reacting para-hydroxybenzophenone with epichlorhydrin in the presence of potassium hydroxide in accordance with the following equation:

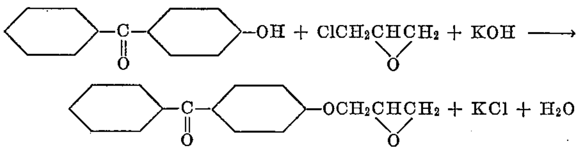

In the process of the invention the nylon and para-benzoylphenyl glycidyl ether reactants may be dissolved in a mutual solvent therefor, such as methanol, ethanol and dimethyl formamide, and the solution heated to effect reaction. The heating of the solution should be under pressure in those cases where the more volatile solvents and elevated temperatures are employed to prevent undue loss of solvent. As an alternative the solution of reactants may be cast as a sheet or film which is dried and the physically mixed film then heated to effect reaction.

In regard to the amounts of reactants, generally the amount of ether is sufficient to substitute on the terminal portions of the polyamide chain from about 0.02 to about 0.33 mole, usually from about 0.1 to about 0.33 mole, of the ether per 1000 grams of the polyamide. For a given amount of the ether reactant, the amount of ether substituted on the polyamide increases as the reaction temperature and time increases.

The reaction is effected by heating the reaction mixture of the ether and nylon at a temperature and for a time sufficient to effect reaction therebetween. The inversely related reaction temperature and time conditions will vary primarily with the reactivity of the terminal functional groups on the nylon, the diamine terminated nylons being more reactive than the non-amino terminated nylons, and with the degree of ether substitution on the nylon desired. Temperatures from about 20° C. to about 200° C. and time periods from about 10 minutes to about 5 hours or longer are satisfactory. A more suitable time-temperature relationship is from about 65° C. to about 150° C. for from about 15 minutes to about 4 hours.

The reaction between nylon and para-benzoylphenyl glycidyl ether is represented by the following equation:

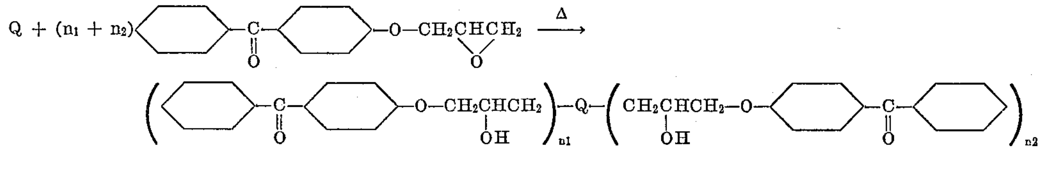

where Q is the nucleus of a synthetic thermoplastic linear polyamide having recurring amide groups as an integral part of the main polymer chain; $n_1$ and $n_2$ are integers from 0 to 2 and $n_1$ plus $n_2$ is from 1 to 4. It has been determined that the reaction between the ether and the nylon is apparently limited to the end groups of the nylon. Greater than end group substitution by the ether is possible, but this appears to be accompanied by a partial degradation of the nylon polymer.

In those cases where the reaction has taken place in a solvent medium, the resulting photosensitive polymeric reaction product can be separated from the reaction solution and excess unreacted para-benzoylphenyl glycidyl ether reactant and deleterious impurities to provide a superior purified product. This can be achieved, for example, by adding to the reaction medium a liquid miscible therewith in which the photosensitive nylon reaction product is insoluble and in which the para-benzoylphenyl glycidyl ether is soluble to thereby cause precipitation of the photosensitive nylon polymer. Typical examples of such liquids include acetone, methylethyl ketone, dioxane, carbitols and cellosolves. The precipitate can then be further separated by conventional methods, such as filtration, centrifugation or decantation, and washed with the liquid in which the photosensitive nylon polymer is insoluble.

In those cases where the reaction has taken place in a physical mixture of the reactants, e.g., in film form, the photosensitive polymeric reaction product may be purified by dissolving it in a solvent therefor, e.g., methanol, and then precipitating the product from this solution, e.g., by acetone.

The photosensitive nylon produced by the process of the present invention, therefore, has the following structural formula:

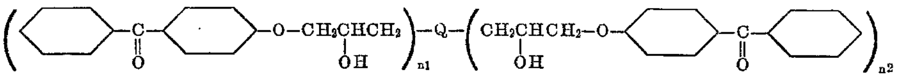

where Q is the nucleus of a synthetic thermoplastic linear polyamide having recurring amide groups as an integral part of the main polymer chain; $n_1$ and $n_2$ are integers from 0 to 2 and $n_1$ plus $n_2$ is from 1 to 4. Thus the following photosensitive nylons are produced by the process of the invention: $n_1$ is 0 and $n_2$ is 1 (conversely $n_1$ is 1 and $n_2$ is 0); $n_1$ is 0 and $n_2$ is 2 (conversely $n_1$ is 2 and $n_2$ is 0); $n_1$ and $n_2$ are both 1; $n_1$ is 1 and $n_2$ is 2 (conversely $n_1$ is 2 and and $n_2$ is 1); and $n_1$ and $n_2$ are both 2. Where the terminal groups of the nylon molecule are both carboxylic acid groups, a total of from 1 to 2 ether groups can be attached thereon; where the terminal groups of the nylon molecule are both amine groups, a total of from 1 to 4 ether groups can be attached thereon; and where the nylon molecule is terminated by a carboxylic acid group at one end and an amine group at the other end, a total of from 1 to 3 ether groups can be attached thereon.

The process and products of the invention are further illustrated by the following non-limiting examples.

EXAMPLE 1

Fifteen grams (0.00115 mole) of a diamine terminated nylon (methanol soluble interpolymer of 160 grams of hexamethylene diammonium adipate, 120 grams of hexamethylene diammonium sebacate, 160 grams of epsilon-caprolactam and 5 grams of a 70% solution of hexamethylene diamine, having a molecular weight of about 13,000 determined by titration) were dissolved in 56 cc. of absolute methyl alcohol. After addition of 1.05 gram (0.00414 mole) of para-benzoylphenyl glycidyl ether, the solution was stirred and refluxed for four hours at a temperature of about 65° C. A 7 cc. sample was withdrawn and the photosensitive nylon reaction product precipitated with acetone. The granular product was filtered and washed twice with acetone.

EXAMPLE 2

Thirty grams (.0014 mole) of a diamine terminated nylon (methanol soluble interpolymer of 160 grams of hexamethylene diammonium adipate, 120 grams of hexamethylene diammonium sebacate, 160 grams of epsilon-and 2.0 cc. or 1.34 grams of a 70% solution of hexamethylene diamine, having a molecular weight of about 21,000 determined by titration) were dissolved in 170 grams of absolute methyl alchool. After addition of 2.3 grams (.0090 mole) of para-benzoylphenyl glycidyl ether, the solution was stirred and refluxed for four hours at about 65° C. The reaction product was precipitated with acetone, filtered and washed twice with acetone.

EXAMPLE 3

Thirty grams (.0015 mole) of Zytel 63 (a commercial interpolymer of hexamethylene diammonium adipate, hexamethylene diammonium sebacate and epsilon-caprolactam, having a molecular weight of about 20,000) were dissolved in 170 grams of absolute methyl alcohol. After addition of 2.3 grams (.0090 mole) of para-benzoylphenyl glycidyl ether, the solution was stirred and refluxed for four hours. The solution was then cast on glass and the film air dried. The dry film was heated in an oven at 100° C. for one hour, redissolved in methanol, precipitated from the methanol solution by acetone and washed twice with acetone.

EXAMPLE 4

2.3 grams (.00012 mole) of Zytel 63 (a commercial interpolymer of hexamethylene diammonium adipate, hexamethylene diammonium sebacate and epsilon-caprolactam, having a molecular weight of about 20,000) were dissolved in 20 grams of dimethyl formamide at 100° C. The solution was cooled to 80° C. and 8.8 grams (.0345 mole) of parabenzoylphenyl glycidyl ether were added. The temperature was raised to 145–150° C. and the solution was heated at this temperature for 2.5 hours. The reaction product was precipitated with acetone, filtered and washed twice with acetone.

The comparative photosensitivity of nylon per se, physical mixtures of nylon with either benzophenone (a known light-sensitive initiator of photopolymerization) or para-benzoylphenyl glycidyl ether, and the photosensitive nylon of the invention was determined in accordance with the following test procedure. A methanol solution containing 15% by weight of the nylon composition to be tested was cast on a glass plate maintained at 32° C. and spread evenly with a drawndown application having a 0.024 inch clearance. The film was substantially air-dried at 32° C. The cast film was exposed for six minutes to a General Electric Company UA11 mercury vapor lamp at 4 inch distance from the film. The exposed film was weighed and then immersed in boiling methanol for a period of four minutes. The exposed film was removed from the methanol, oven dried at 60° C., and weighed again. The quotient of the final weight divided by the initial weight multiplied by 100 represents the percent of the tested composition which had been rendered insoluble in boiling methanol by exposure to an actinic light source and therefore is a direct measure of the photosensitivity of the various tested compositions.

The results of this comparative photosensitivity test are set forth in the following table.

TABLE I

| Item | Nylon Composition | Percent insoluble in boiling methanol |
|---|---|---|
| 1 | Non-amino terminated nylon (nylon reactant of Examples 3 and 4). | 0 |
| 2 | Diamine terminated nylon (nylon reactants of Examples 1 and 2). | 0 |
| 3 | Physical mixture of non-amino terminated nylon (nylon reactant of Examples 3 and 4) plus 5% benzophenone based on the weight of the nylon. | 0 |
| 4 | Physical mixture of diamine terminated nylon (nylon reactant of Example 2) plus 5% benzophenone based on the weight of the nylon. | 28 |
| 5 | Physical mixture of non-amino terminated nylon (nylon reactant of Examples 3 and 4) plus 7% parabenzoylphenyl glycidyl ether based on the weight of the nylon. | 16 |
| 6 | Physical mixture of diamine terminated nylon (nylon reactant of Example 2) plus 7% para-benzoylphenyl-glycidyl ether based on the weight of the nylon. | 28 |
| 7 | Reaction product of a non-amino terminated nylon and para-benzoylphenyl glycidyl ether (product of Examples 3 and 4): | |
| | Example 3 | 74 |
| | Example 4 | 85 |
| 8 | Reaction product of a diamine terminated nylon and para-benzoylphenyl glycidyl ether (product of Examples 1 and 2): | |
| | Example 1 | 79 |
| | Example 2 | 68 |

The comparative data set forth in the above Table I establish that nylon per se is not photosensitive as shown by the fact that none of the light-exposed nylon of Items 1 and 2 was insoluble in boiling methanol. The comparative data for Items 3 through 6 establish that physical mixtures of nylon with either benzophenone or para-benzoylphenyl glycidyl ether have no or only limited photosensitivity as shown by the fact that only from 0 to 28% of the physical mixtures was rendered insoluble in boiling methanol after exposure thereof to actinic light. On the other hand, however, Items 7 and 8 clearly establish that the nylon of the invention is remarkably photosensitive as shown by the fact that from 68% to 85% thereof was rendered insoluble in boiling methanol after exposure thereof to actinic light. Moreover, the light-exposed nylon films of Items 7 and 8 were clear, strong, flexible, substantially non-hygroscopic and thermoset or cross-linked.

It is of interest to note that nylon cannot be reacted with or chemically modified by benzophenone to impart photosensitivity thereto. Thus a dimethyl formamide solution of the physical mixture of the above Item 3 and a methanol solution of the physical mixture of the above Item 4 were heated at 145–150° F. for 2.5 hours and at 65° C. for 4 hours respectively, the nylon products recovered and tested for photosensitivity in accordance with the above procedure. The products had no photosensitivity as shown by the fact that 0% thereof was rendered insoluble in boiling methanol after exposure to actinic light.

EXAMPLES 5–7

Thirty grams (0.0031 mole) of a purified predominantly amine terminated nylon (methanol soluble interpolymer of 160 grams of hexamethylene dimmonium adipate, 120 grams of hexamethylene diammonium sebacate, 160 grams of epsilon-caprolactam and 2.0 cc. or 1.34 grams of a 70% solution of hexamethylene diamine, having a molecular weight of about 9,600 determined by intrinsic viscosity and having a ratio of amine end groups to carboxylic acid end groups of 1.53:0.47 determined by titration) were dissolved in 160 grams of methanol. After addition of 4.6 grams (0.018 mole) of para-benzoylphenyl glycidyl ether, the solution was stirred and refluxed for 3 hours at about 65° C.

About half (Example 5) of the somewhat cooled solution was poured into the vortex of one liter of rapidly stirred acetone to remove excess unreacted para-benzoylphenyl glycidyl ether. The fibrous product was washed three times with acetone and dried.

The remaining half (Example 6 and 7) of the solution was cast in thin films on glass with a Byrd applicator (0.0025 inch dry film) and the films were dried at 35° C. The dry films were removed from the glass and were dried under high vacuum in an Abderhalden dryer at room temperature.

The heat treatment of the films was carried out in the Abderhalden dryer under an atmosphere of nitrogen. Two separate samples of the predominantly amine terminated nylon were heated at 100° C. (boiling water) for one hour (Example 6) and at 140° C. (boiling xylene) for 45 minutes (Example 7).

At the end of the heat treatment, any excess ether reactant was removed as described above. The film was redissolved in methanol, precipitated with acetone, washed in acetone and dried.

By spectrophotometric analysis it was determined that fr the reaction mixture heated only at 65° C. for 3 hours (Example 5) 0.13 mole of ether was terminally substituted per 1,000 grams of the nyyon; that for the reaction mixture further heated at 100° C. for one hour (Example 6) 0.23 mole of ether was terminally substituted per 1,000 grams of the nylon; and that for the reaction mixture further heated at 140° C. for 45 minutes (Example 7) 0.33 mole of ether was terminally substituted per 1,000 grams of the nylon.

EXAMPLES 8–10

Thirty grams (0.002 mole) of a purified predominantly carboxylic acid terminated nylon (methanol soluble interpolymer of 160 grams of hexamethylene diammonium adipate, 120 grams of hexamethylene diammonium sebacate, 160 grams of epsilon-caprolactam and 1.7 grams of adipic acid having a molecular weight of about 15,000 determined by intrinsic viscosity and having a ratio of amine end groups to carboxylic acid end groups of 0.80:1.20 determined by titration) were dissolved in 160 grams of methanol. After addition of 4.6 grams (0.018 mole) of parabenzoylphenyl glycidyl ether, the solution was stirred and refluxed for 3 hours at about 65° C.

The solution was cast in thin films on glass with a Byrd application (0.0025 inch dry film) and the films were dried at 35° C. The dry films were removed from the glass and were dried under high vacuum in an Abderhalden dryer at room temperature.

The heat treatment of the films was caried out in the Abderhalden dryer under an atmosphere of nitrogen. Three separate samples of the predominantly carboxylic acid terminated nylon were heated at 100° C. for one hour (Example 8), at 140° C. for 45 minutes (Example 9) and at 140° C. for two hours (Example 10).

At the end of the heat treatment any excess after reactant was removed as described in Examples 5–7. The films were redissolved in methanol, precipitated with acetone, washed in acetone and dried.

By spectrophotometric analysis it was determined that for the reaction mixture further heated to 100° C. for one hour (Example 8) 0.10 mole of ether were terminally substituted per 1,000 grams of the nylon; that for the reaction mixture further heated at 140° C. for 45 minutes (Example 9) 0.16 mole of ether were terminally substituted per 1,000 grams of the nylon; and that for the reaction mixture further heated at 140° C. for two hours (Example 10) 0.20 mole of ether were terminally substituted per 1,000 grams of the nylon.

The photosensitivity of the photosensitive nylons of Examples 5 through 10 above was determined in accordance with the following test procedure. A methanol solution containing 15% by weight of the nylon to be tested was cast on a glass plate with a Byrd applicator (0.0025 inch dry film), dried at 35° C. for 30–45 minutes and removed from the plate. Before exposure, the free films were dried for thirty minutes in an Abderhalden dryer at 2 mm. vacuum.

The dry films were cut in ½ to ¾ inch strips and were mounted about one inch apart on black photographic masking paper. The mounted strips were exposed to a water-jacketed General Electric UA-11 mercury vapor lamp at 4 inches for an exposure period of 6 minutes.

The exposed strips were cut from the mount, weighed and boiled for 4 minutes in methanol. The insoluble films were removed from the methanol with platinum tipped forceps and dried for 2 hours at 70–75° C. and weighed again. The quotient of the final weight divided by the initial weight multiplied by 100 represents the percent of the tested nylon which had been rendered insoluble in boiling methanol by exposure to an actinic light source and therefore is a direct measure of the photosensitivity of the various tested nylons.

The results of this photosensitivity test are set forth in the following table:

TABLE II

| Example No.: | Percent insoluble in boiling methanol |
|---|---|
| 5 | 82.8 |
| 6 | 82.5 |
| 7 | 82.9 |
| 8 | 83.3 |
| 9 | 91.2 |
| 10 | 90.0 |

The data in Table II above further establish that the nylon of the invention is remarkably photosensitive as shown by the fact that from 82% to 91% thereof was rendered insoluble in boiling methanol after exposure thereof to actinic light. Other photosensitivity test data indicate that the extent of photoinsolubilization increases with increasing light exposure periods.

The photosensitive nylon of the invention is valuable in forming printing plates and films made wholly of the photosensitive nylon. Such plates and films are photosensitive throughout. The present invention also makes possible the formation of coated printing plates on any base by the deposition by any known process of films or coatings of the photosensitive nylon thereon. Typical bases are metal sheets, sheets made of synthetic resins and cellulose derivatives, fabrics, paper and leather. The plates formed wholly of or coated with the photosensitive nylon are useful in photography, photomechanical reproductions, lithography, and intaglio printing. More specific examples of such uses are offset printing, silk screen printing, duplicating pads, manifold stencil sheeting coatings, lithographic plates, relief plates, and gravure plates.

In the formation of photosensitive plates from the photosensitive nylon of the invention, there may be incorporated therewith various adjuvants, if desired. Typical of such adjuvants are materials which further increase the photosensitivity of the photosensitive nylon, such as monomeric compounds containing vinylidene groups. Typical of such vinylidene compounds are N,N'-hexamethylenebisacrylamide, N,N'-methylenebisacrylamide and N,N'-methylenebismethaacrylamide. Another typical optional adjuvant material is a polymerization inhibitor or heat stabilizer. Representative examples thereof include methylene blue, pyrogallol, quinone and hydroquinone. Thus when the photosensitive nylons of Examples 6 and 8 (5.0 grams of a 15% methanol solution thereof) were blended with 0.0415 gram of methylene bisacrylamide and 0.5 cc. of methylene blue and tested by the photosensitivity test procedure of Examples 5–10, the percent insoluble in boiling methanol was increased to 91.7% (versus 82.5% for Example 6) and 90.9% (versus 83.3% for Example 8).

It will thus be seen that the present invention provides a novel and highly useful photosensitive nylon, a process for producing the same and printing plates using the photosensitive nylon which have application to the printing industry. Since various modifications and changes may be made in the products and process of the invention without departing from the spirit thereof, the invention is to be limited only within the scope of the appended claims.

What is claimed is:

1. A photosensitive polycarbonamide having the structural formula

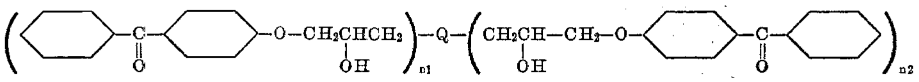

where Q is the nucleus of a film-forming synthetic thermoplastic linear polycarbonamide having recurring amide groups as an integral part of the main polymer chain and having carboxylic acid or amine terminal groups; $n_1$ and $n_2$ are integers from 0 to 2 and $n_1$ plus $n_2$ is from 1 to 4, and the para-benzoylphenyl glycidyl ether groups are attached to Q at the terminal groups thereon.

2. The photosensitive polycarbonamide as defined by claim 1 wherein $n_1$ is 0 and $n_2$ is 1.

3. The photosensitive polycarbonamide as defined by claim 1 wherein $n_1$ is 0 and $n_2$ is 2.

4. The photosensitive polycarbonamide as defined by claim 1 wherein $n_1$ and $n_2$ are both 1.

5. The photosensitive polycarbonamide as defined by claim 1 wherein $n_1$ is 1 and $n_2$ is 2.

6. The photosensitive polycarbonamide as defined by claim 1 wherein $n_1$ and $n_2$ are both 2.

7. The process for the preparation of a photosensitive polycarbonamide which comprises heating a mixture of (1) a film-forming synthetic thermoplastic linear polycarbonamide having recurring amide groups as an integral part of the main polymer chain and having carboxylic acid or amine terminal groups and (2) an amount of para-benzoylphenyl glycidyl ether sufficient to substitute on the terminal portions of the polycarbonamide chain from about 0.02 to about 0.33 mole of said ether per 1000 grams of said polycarbonamide at a temperature from about 20° C. to about 200° C. for from about 10 minutes to about 5 hours, said temperature and said time being inversely related.

8. The process as defined by claim 7 wherein the temperature is from about 65° C. to about 150° C. and the time is from about 15 minutes to about 4 hours.

9. The process as defined by claim 7 wherein the terminally substituted amount of said ether is from about 0.1 to about 0.33 mole thereof per 1000 grams of said polycarbonamide.

References Cited

UNITED STATES PATENTS 3,081,168 3/1963 Leekley et al. ---------- 96—35

WILLIAM H. SHORT, Primary Examiner

L. L. LEE, Assistant Examiner

U.S. Cl. X.R.

96—36.3; 260—33.4, 45.7, 45.95, 65, 78

PO-1050
(5/69)

UNITED STATES PATENT OFFICE
CERTIFICATE OF CORRECTION

Patent No. 3,474,071 Dated Oct. 21, 1969

Inventor(s) Donald J. Byers, Robert M. Leekley and Margaret H.

It is certified that error appears in the above-identified patent and that said Letters Patent are hereby corrected as shown below:

Col. 4, line 8, "epsilon-" should read --epsilon-caprolactam- line 59, "application" should read --applicator--. Col. 5, line 58, "dimmonium" should read --diammonium--; line 74, "Example" should read --Examples--. Col. 6, line 16, "fr" should read --for--; line 18, "nyyon" should read --nylon--; line 40, "application" should read --applicator--; line 44, "caried" should read --carried--; line 50, "after" should rea --ether--; lines 52 and 53, "ace- ne" should read --acetone- line 55, "to" should read --at--; lines 56, 59 and 62, "were" should read --was--. Col. 7, line 53, "photosensitive plates should read --photosensitive printing plates--.

SIGNED AND
SEALED
MAY 26 1970

(SEAL)
Attest:

Edward M. Fletcher, Jr.
Attesting Officer

WILLIAM E. SCHUYLER, JR.
Commissioner of Patents